(12) United States Patent
Fukunaga

(10) Patent No.: US 6,488,522 B2
(45) Date of Patent: Dec. 3, 2002

(54) SOCKET FOR ELECTRIC PART

(75) Inventor: Masami Fukunaga, Kawaguchi (JP)

(73) Assignee: Endlas Corporation, Saitama (JP)

( * ) Notice: Subject to any disclaimer, the term of this patent is extended or adjusted under 35 U.S.C. 154(b) by 0 days.

(21) Appl. No.: 09/801,293

(22) Filed: Mar. 7, 2001

(65) Prior Publication Data

US 2001/0021601 A1 Sep. 13, 2001

(30) Foreign Application Priority Data

Mar. 10, 2000 (JP) ........................................ 2000-066286

(51) Int. Cl.[7] ................................................. H01R 9/09
(52) U.S. Cl. ....................................... 439/331; 439/266
(58) Field of Search ........................... 439/342, 68, 71, 439/72, 260–266, 330, 331

(56) References Cited

U.S. PATENT DOCUMENTS 4,728,297 A * 3/1988 Cohen .......................... 439/331
5,415,559 A * 5/1995 Ichimura ....................... 439/259
5,611,705 A * 3/1997 Pfaff ............................. 439/266
5,669,780 A * 9/1997 Fukunaga ..................... 439/342
6,106,319 A * 8/2000 Fukunaga et al. ........... 439/342

* cited by examiner

*Primary Examiner*—Hien Vu
(74) *Attorney, Agent, or Firm*—Koda & Androlia

(57) ABSTRACT

A socket for an electric part includes a pair of slide plates 7 and 8 movable in opposite directions. Contact pin-pressing portions 9 are provided on each of the slide plates 7 and 8 for opening each of contact pins 3 to opposite sides, and operating arms 18 are disposed on a socket body 2 of the socket for turning movement about base ends, and are connected to the slide plates 7 and 8 for operating the slide plates 7 and 8, respectively. Operating projections 28 are disposed on an operating member 22 for turning the operating arms 18 by the vertical movement of the operating member 22, so that the operating arms 18 are turned by the operating projections 28 by urging the operating member 22 downwards to move the slide plates 7 and 8. Thus, the slide plates can be moved easily by urging the operating member by a smaller force.

6 Claims, 5 Drawing Sheets

SOCKET FOR ELECTRIC PART

BACKGROUND OF THE INVENTION

1. Field of the Invention

The present invention relates to a socket for an electric part and more particularly, to a socket for an electric part for providing an electric connection between terminals of the electric part and an external electric test circuit in order to carry out a performance test of the electric part.

2. Description of the Related Art

In order to carry out the performance test of an electric part such as a semiconductor device or the like, a socket for an electric part for providing an electric connection of terminals of the electric part with an external electric test circuit is conventionally used in many cases.

In such a socket for an electric part, a positioning plate is disposed on a socket body, so that the electric part is placed on the positioning plate. Contact pins are disposed on the socket body, and a slide plate slidable in a horizontal direction is disposed between the positioning plate and the socket body. Further, an operating member for moving the slide plate is disposed for vertical movement relative to the socket body.

In this socket, the slide plate is slid in the horizontal direction through a link mechanism by lowering the operating member, thereby resiliently deforming one of resilient pieces of a contact pin to open upper ends of the resilient pieces. Thereafter, an electric part is placed on the positioning plate, and the operating member is lifted, thereby moving the slide plate back to its original position to release an urging force on the contact pin. This permits the contact pin to be returned to its initial position under its resilient force, whereby the tip ends of the contact pins clamp terminals of the electric part and as a result, the electric connection of the electric part is achieved.

However, such conventional socket for the electric part suffers the following problem: Since the slide plate is slid in the horizontal direction through the link mechanism by lowering the operating member, it is necessary to convert a downward urging force to a force in the horizontal direction perpendicular to an urging direction and hence, a larger force for urging. the operating member is required.

Another problem is as follows: One of the resilient pieces of the contact pin is opened out, whereby each of the terminals of the electric part is clamped by the resilient pieces and hence, a larger amount of movement of the resilient piece is required. For this reason, the repulsion force of the contact pin is increased, and hence, a larger force is required to move the slide plate. A further problem is that the load stress on the contact pin is increased to bring about a reduction in life of the contact pin.

SUMMARY OF THE INVENTION

Accordingly, it is an object of the present invention to provide a socket for an electric part, wherein the slide plate can be moved easily by urging the operating member by a smaller force.

To achieve the above object, according to a first aspect and feature of the present invention, there is provided a socket for an electric part, comprising a socket body having a plurality of contact pins disposed thereon, each of the contact pins having resilient pieces capable of clamping each of terminals of an electric part, a slide plate disposed above the socket body and movable in a substantially horizontal direction, and an operating member disposed movably in a vertical direction relative to the socket body for sliding the slide plate, so that the slide plate is moved by the vertical movement of the operating member, whereby tip ends of the contact pins are opened and closed to come into and out of contact with the terminals of the electric part, wherein a plurality of the slide plates movable in opposite directions are laminated vertically on one another, each of the slide plates being provided with contact pin-pressing portions for opening the contact pin; the socket body having operating arms turnably disposed thereon and connected to the slide plates for moving the slide plates; and the operating member has operating projections disposed thereon for turning the operating arms by vertical movement of the operating member, so that the operating arms are turned by the operating projections by urging the operating member downwards, thereby moving the slide plates.

With the arrangement of the first feature, the operating projections of the operating member turn the operating arms by urging the operating member downwards, thereby moving the slide plates in the opposite directions. With this movement of the slide plates, the contact pin-pressing portions provided on the slide plates open the resilient pieces of each of the contact pins into their states in which each of the terminals can be clamped by the resilient pieces. Therefore, the amount of movement of each of the resilient pieces of the contact pin can be reduced by half, and the repulsion force of each of the resilient pieces is also reduced. As a result, the slide plates can be moved by a smaller force.

According to a second aspect and feature of the present invention, in addition to the first feature, each of the slide plates has plate arm portions provided thereon, and each of the operating arms has an operating pin formed at its intermediate portion, so that the operating arms and the slide plates are interconnected by bringing the operating pins into engagement with tip ends of the plate arm portions.

With the above arrangement of the second feature, the operating pins formed at the intermediate portions of the operating arms are brought into engagement with the tip ends of the plate arm portions provided on the slide plates, thereby connecting the operating arms to the slide plates. The tip ends of the operating arms are urged by the operating projections provided on the operating member to move the operating pins on the operating arms bya principle of lever, thereby move the plate arm portions to move the slide plates. Therefore, the slide plates can be moved easily, and the operating member can be urged by a smaller force.

According to a third aspect and feature of the present invention, in addition to the first or second feature, the operating arms are connected at their base ends to each other, so that they are turned about connected portions thereof.

With the above arrangement of the third feature, the operating arms are connected at their base ends to each other, so that they are turned about the connected portions. Therefore, a repulsion force produced upon movement of the slide plates can be countervailed by the connected portions of the operating arms.

According to a fourth aspect and feature of the present invention, in addition to any of the first to third features, the turnable portions of the operating arms are disposed in the vicinity of a center of movement of each of the slide plates.

With the above arrangement of the fourth feature, the turnable portions of the operating arms are disposed in the vicinity of a center of movement of each of the slide plates and hence, when the operating member is urged, the urging of the operating member can be carried out stably.

The above and other objects, features and advantages of the invention will become apparent from the following description of the preferred embodiment taken in conjunction with the accompanying drawings.

DESCRIPTION OF THE PREFERRED EMBODIMENTS

The present invention will now be described by way of an embodiment with reference to FIGS. 1 to 6.

Figure 1:
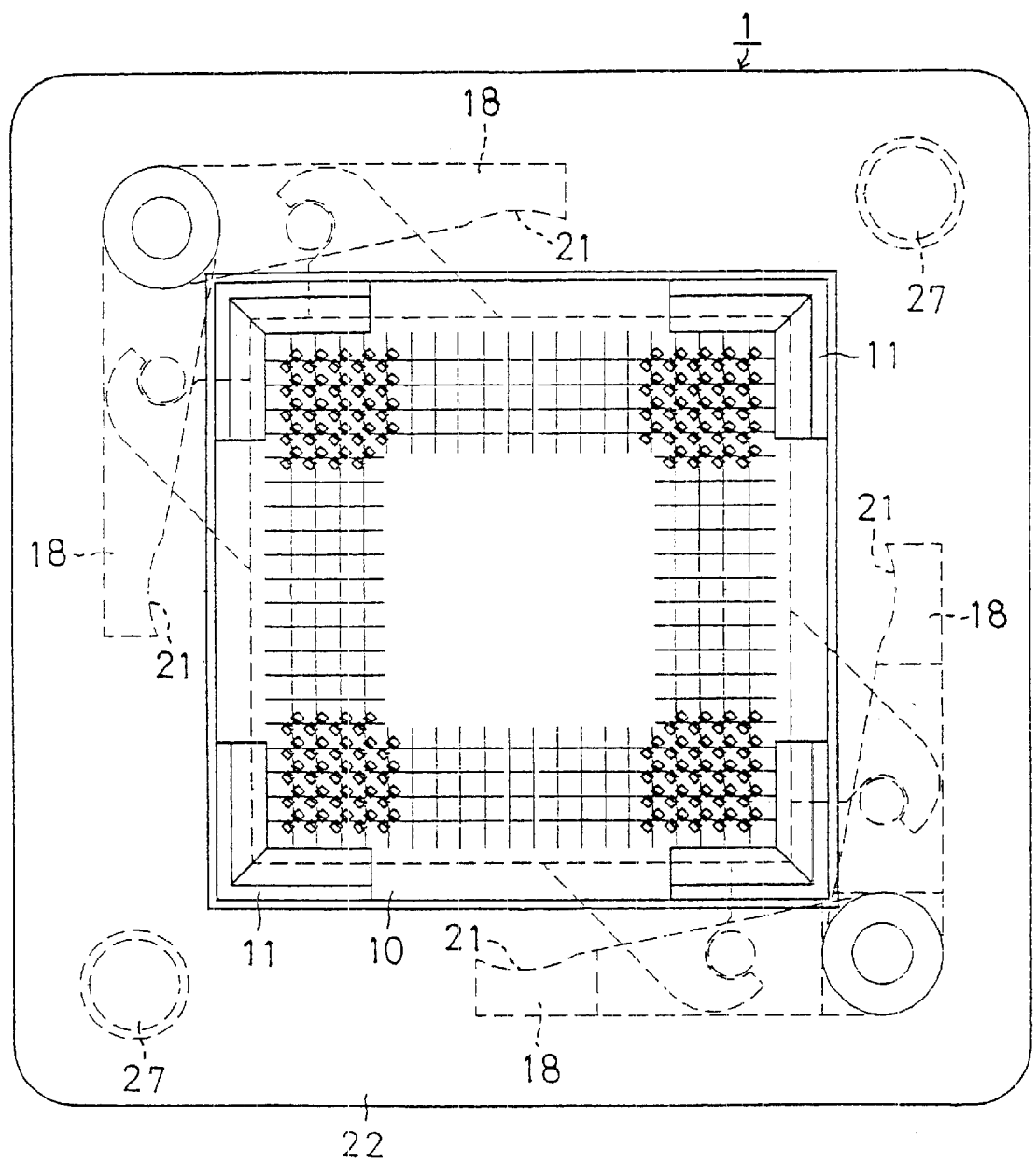
FIG. 1 is a plan view of an embodiment of a socket for an electric part according to the present invention.
Figure 2:
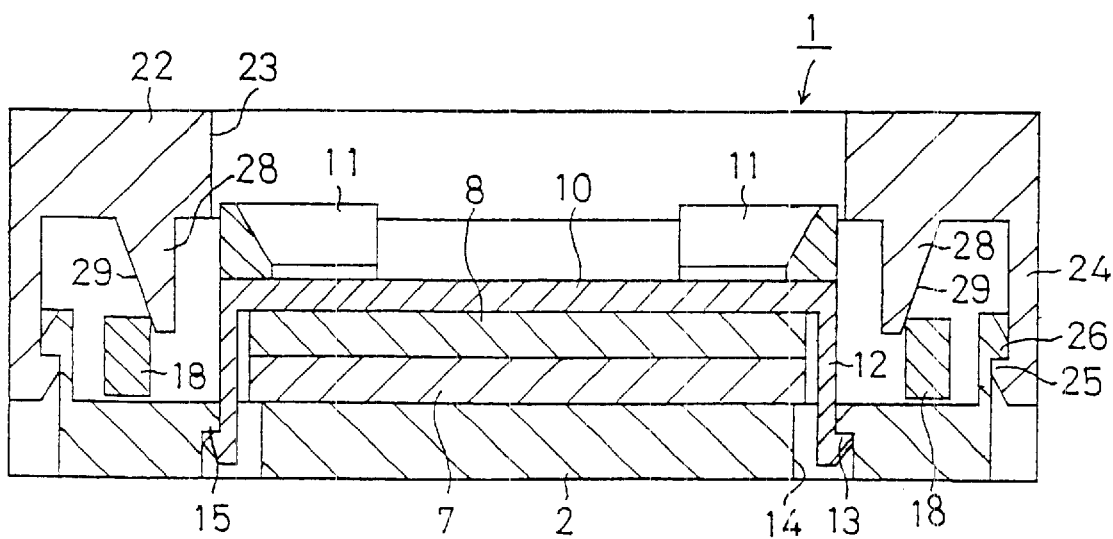
FIG. 2 is a front sectional view of the socket for the electric part shown in FIG. 1.

A socket 1 for an electric part according to an embodiment of the present invention shown in FIGS. 1 and 2 is adapted to electrically connect solder balls arranged as terminals of an electric part (not shown) such as an IC package in a lattice fashion and an external electric test circuit (not shown) in order to carry out a performance test of the electric part.

The socket 1 for the electric part has a socket body 2 mounted on the external electric test circuit, and a plurality of contact pins 3 (shown in FIGS. 3 and 4) are arranged in a lattice fashion on the socket body 2 to correspond to the solder balls.

Figure 3:
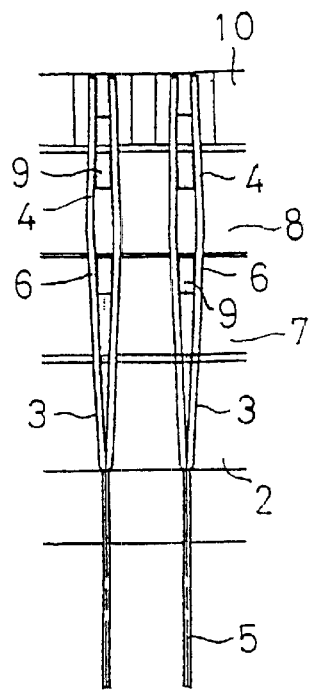
FIG. 3 is a front view showing contact pins used in the socket for the electric part shown in FIG. 1.
Figure 4:
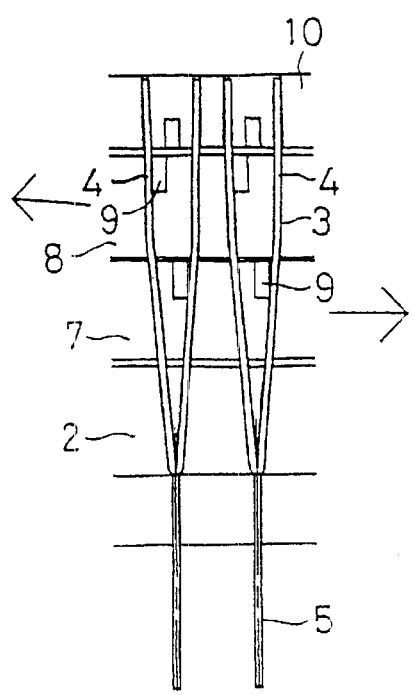
FIG. 4 is a front view showing the contact pins shown in FIG. 3 in their opened state.

A pair of resilient pieces 4, 4 made of a material having a conductivity are formed on each of the contact pins 3, and a single solder tail portion 5 is integrally formed at a lower portion of the contact pin 3, as shown in FIGS. 3 and 4. Further, portions 6 folded in directions away from each other are formed at intermediate portions of the resilient pieces 4.

Each of the contact pins 3 is retained in a righted state with respect to the socket body 2 by press-fitting the solder tail portion 5 into a substrate (not shown) disposed on a lower surface of the socket body 2. A lowermost end of the solder tail portion 5 is adapted to be connected to a printed wiring board by inserting it into each of through-bores (not shown) in the printed wiring board and soldering it. Further, the resilient pieces 4 of each of the contact pins 3 are formed, so that they are deformed resiliently by pressing of top points thereof toward each other in a state in which they has been inserted through the socket body 2.

A lower slide plate 7 and an upper slide plate 8 are disposed in a laminated arrangement on an upper surface of the socket body 2, and are movable in diagonally opposite directions. Further, the resilient pieces 4 of each contact pin 3 are inserted through the slide plates 7 and 8, and contact pin-pressing portions 9 are formed on the slide plates 7 and 8. The contact pin-pressing portions 9 are located between the resilient pieces 4 of each contact pin 3 in a usual state, as shown in FIGS. 3 and 4, and when the slide plates 7 and 8 are moved, the contact pin-pressing portions 9 press the resilient pieces 4 of each contact pin 3 in opposite directions to reliantly deform them.

A positioning plate 10 is disposed on an upper surface of the upper slide plate 8 to support an upper end of the contact pin 3, so that an electric par may be placed on an upper surface of the positioning plate 10. Guide portions 11 for positioning an electric part at a predetermined location are provided on the upper surface of the positioning plate 10 in correspondence to corners of the electric part. Further, locking pieces 12 are provided at opposite sides of the positioning plate 10 to protrude downwards, and a locking claw 13 is formed at a lower end of each of the locking pieces 12 to protrude slightly outwards. On the other hand, engage bores 14 are defined in the socket body 2 at locations corresponding to the locking pieces 12, and locking projections 15 are formed on an inner surface of the engage bores and adapted to be engaged with the locking claws 13 of the locking pieces 12 on the positioning plate 10. Thus, thepositioning plate 10 is retained in a state in which the slide plates 7 and 8 have been clamed between the positioning plate 10 and the socket body 2, by bringing the locking claws 13 of the locking pieces 12 of the positioning plate 10 into engagement with the locking projections 15 of the socket body 2.

Plate arm portions 16, 16 are projectingly provided on sides of the lower slide plate 7 in directions of movement of the lower slide plate 7 (on an upper side and a right side as viewed in FIG. 5) in the vicinity of corners in directions perpendicular to the directions of movement of the upper and lower slide plates 7 and 8, respectively. Likewise, plate arm portions 16, 16 are projectingly provided on sides of the upper slide plate 8 in directions of movement of the upper slide plate 8 (on a left side and a lower side as viewed in FIG. 5) in the vicinity of corners in directions perpendicular to the directions of movement of the upper and lower slide plates 7 and 8 to extend in the directions perpendicular to the moving directions, respectively. Pin-supporting recesses 17 each having a substantially semi-spherical shape are defined at tip ends of the plate arm portions 16.

Operating arms 18, 18 are disposed on upper surfaces of the plate arm portions 16 of the lower slide plate 7 to extend in directions of sides of the slide plates 7 and 8, respectively, and operating arms 18, 18 are also disposed on lower surfaces of the plate arm portions 16 of the upper slide plate 8 to extend in directions of sides of the slide plates 7 and 8, respectively. The operating arms 18 located in the directions perpendicular to the directions of movement of the slide plates 7 and 8 are connected to each other by a connecting member 19 in the vicinity of the corners of the slide plates 7 and 8, and are turnable about the connecting member 19 relative to each other. Operating pins 20 are projectingly provided at intermediate portions of the operating arms 18 for engagement into the pin-supporting recesses 17 in the plate arm portions 16, and operating recesses 21 are defined in those surfaces of tip ends of the operating arms 18, which are opposed to the slide plates 7 and 8, respectively.

An operating member 22 is disposed on the upper surface of the positioning plate 10 and has an opening 23 defined at its central portion for mounting an electric part onto the upper surface of the positioning plate 10. A downward-extending limiting piece 24 is projectingly provided on an outer peripheral side of the operating member 22, and a limiting claw 25 is formed at a lower end of the limiting piece 24 to protrude slightly inwards. On the other hand, an engage claw 26 is formed on an outer peripheral surface of the socket body 2 and adapted to be engaged with the limiting claw 25 of the limiting piece 24. A spring 27 such as a coil spring is disposed between the operating member 22 and the socket body 2 for biasing the operating member 22 away from the socket body 2. Further, operating projections 28 are formed on a lower surface of the operating member 22 at locations corresponding to the operating recesses 21 in the operating arms 18 to extend downwards, so that they abut against the operating recesses 21. A surface of each of the operating projections 28, which abuts against the pperating recess 21, is a tapered surface such that the width dimension thereof is gradually increased upwards.

In a usual state, the operating member 22 is located above the socket body 2 at a distance apart from the socket body 2 and retained in a state in which the limiting claws 25 of the limiting pieces 24 of the operating member 22 are in engagement with the engage claws 26 of the socket body 2. When the operating member 22 is urged downwards against a biasing force of,the biasing spring 27, the limiting claws 25 of the limiting pieces 24 of the operating member 22 are disengaged from the engage claws 26 of the socket body 2, so that it can be moved downwards by a given amount. The downward movement of the operating member 22 causes the operating recesses 21 in the operating arms 18 to be gradually urged by the operating projections 28, so that the operating arms 18 can be turned about the connecting member 19.

The operation of the socket according to the present embodiment will be described below.

Figure 5:
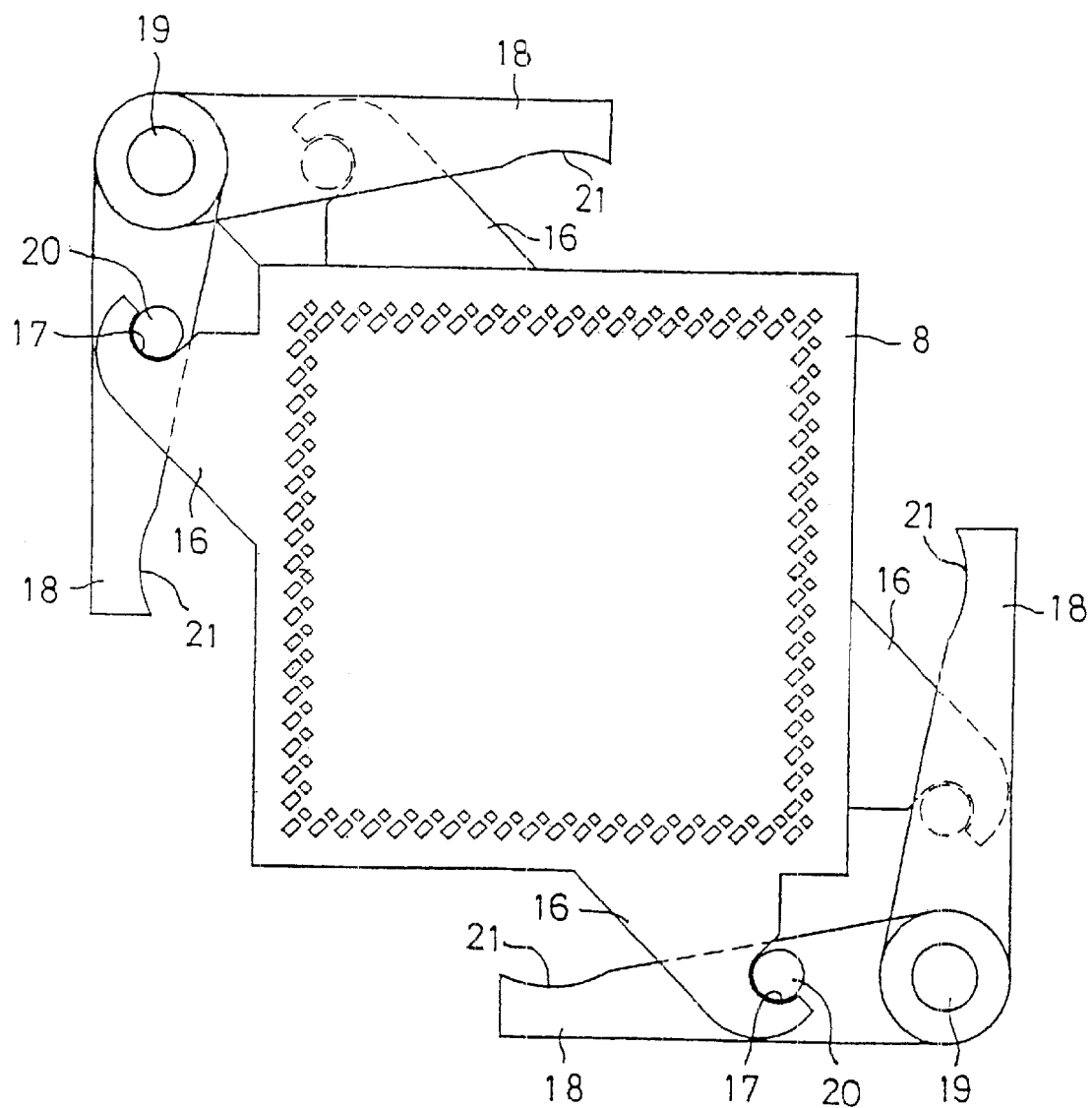
FIG. 5 is a plan view showing slide plates shown in FIG. 1.

To mount an electric part on the socket 1, the operating member 22 is first urged downwards against the biasing force of the biasing spring 27 from the state shown in FIGS. 1 and 5, whereby the limiting claws 25 of the limiting pieces 24 of the operating member 22 are disengaged from the engage claws 26 of the socket body 2 and moved downwards by the given amount. Then, the operating recesses 21 in the operating arms 18 are gradually urged by the tapered surfaces 29 of the operating projections 28 by the downward movement of the operating member 22, whereby the operating arms 18 are turned about the connecting member 19. The turning movement of the operating arms 18 causes the operating pins 20 to urge the pin-supporting recesses 17 in the plate arm potions 16, thereby moving the plate arm portions 16 to move the slide plates 7 and 8 in the opposite directions, as shown in FIG. 6.

Figure 6:
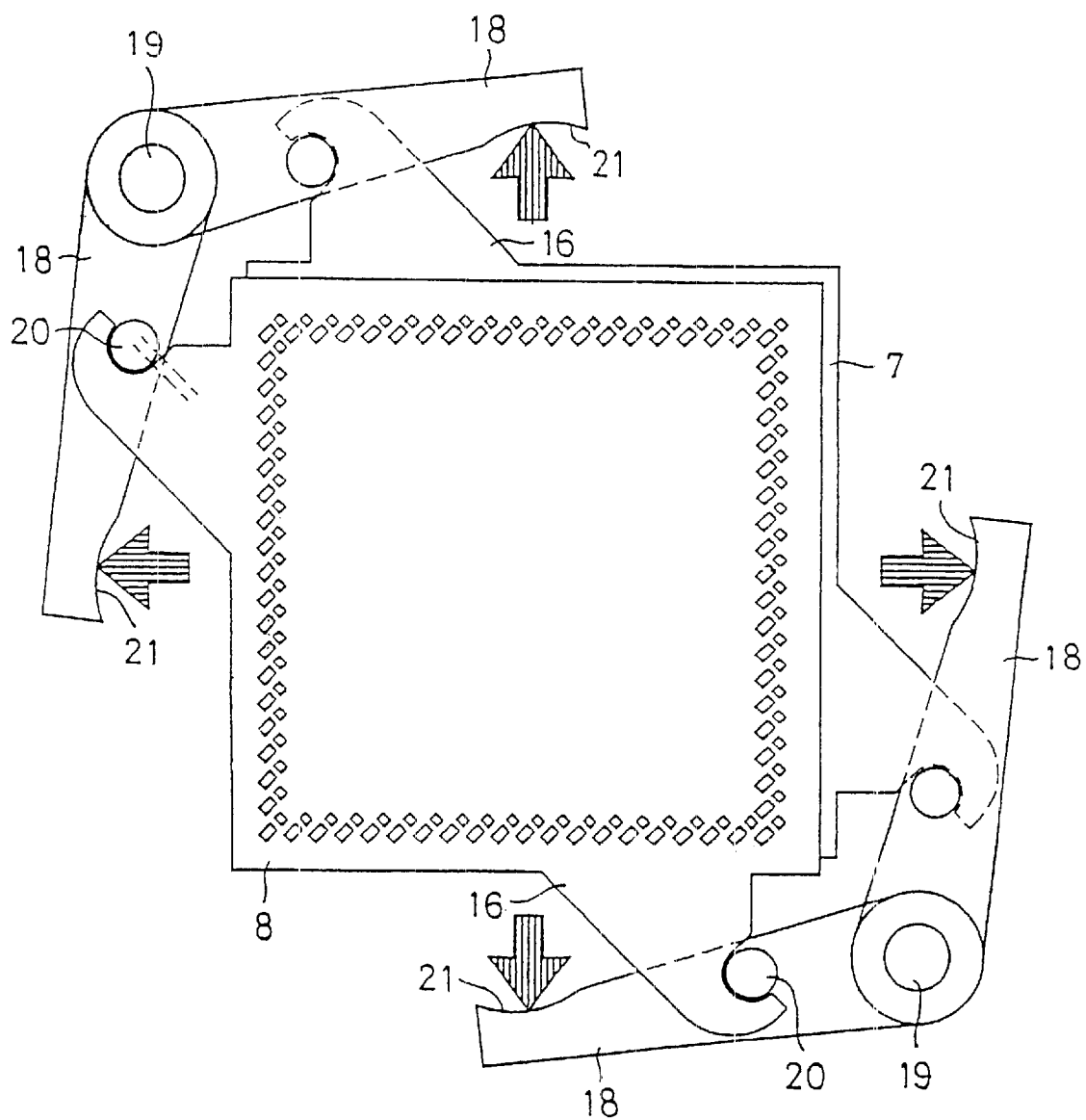
FIG. 6 is a plan view showing the slide plates shown in FIG. 5 in their moved states.

With the movement of the slide plates 7 and 8, the resilient pieces 4 are pressed and resiliently deformed by the contact pin-pressing portions 9, whereby the tip ends of the resilient pieces 4 are opened from the state shown in FIG. 6, as shown in FIG. 4.

In this case, the resilient pieces 4 of the contact pin 3 are opened to the opposite sides by the contact pin-pressing portions 9 provided on the slide plates 7 and 8 in the present embodiment. Therefore, the amount of movement of each of the resilient pieces 4 of the contact pin 3 can be reduced by half, and the repulsion force of each resilient piece 4 during the movement can be reduced. As a result, the slide plates 7 and 8 can be moved by a smaller force. Moreover, the operating recesses 21 defined at the tip ends of the operating arms 18 are urged by the operating projections 28, and the operating pins 20 located at the intermediate portions of the operating arms 18 are moved by a principle of lever to move the plate arm portions 16. Therefore, the slide plates 7 and 8 can be moved by urging the operating member 22 by a smaller force.

In this state, the electric part is guided to the guide portions 11 and placed at the predetermined location on the upper surface of the positioning plate 10, where by each of the solder ball of the electric part is inserted in a non-contact state between the opened tip ends of each contact pin 3.

When the downward urging force on the operating member 22 is then released, the operating member 22 is lifted under the action of the biasing force of the spring 27, until the limiting claws 25 of the limiting pieces 24 of the operating member 22 are brought into engagement with the engage claws 26 of the socket body 2. With this lifting movement, the operating projections 28 are also lifted, whereby the urging force on the operating arms 18 is released. Thus, the slide plates 7 and 8 are returned to their original positions under the action of the resilient forces of the resilient pieces 4 of the contact pin 3 and with this returning movement, the operating arms 18 are returned to their original positions through the plate arm portions 16 and the movable pins. Thus, each of the solder balls of the electric part is clamped by the tip ends of each of the resilient pieces 3 of the contact pin 3. As a result, the solder balls of the electric part and the external electric test circuit are electrically interconnected through the contact pins 3.

To remove the electric part from the mounted state the operating member 22 is likewise lowered, thereby opening the tip ends of the contact pin 3. This causes the solder balls of the electric part to be disengaged from the contact pin and thus, the electric part can be removed easily by a weaker force.

Therefore, in the present embodiment, the resilient pieces 4 of each contact pin 3 are opened to the opposite sides by moving the slide plates 7 and 8 in the opposite directions. Therefore, the amount of movement of each of the resilient pieces 4 of the contact pin 3 can be reduced by half, and the repulsion force of each resilient piece 4 during the movement can be reduced and as a result, the slide plates 7 and 8 can be moved by a smaller force. Additionally, a load stress on the contact pin 3 can be reduced and hence, the life of the contact pin 3 can be prolonged. Further, the reduction in load stress on the contact pin 3 ensures that the length dimension of the resilient piece 4 of the contact pin 3 can be reduced, and the height dimension of the entire socket can be reduced.

In addition, the operating recesses 21 defined at the tip ends of the operating arms 18 are urged by the operating projections 28, whereby the operating pins 20 located at the intermediate portions of the operating arms 18 are moved by the principle of lever to move the plate arm portions 16. Therefore, the slide plates 7 and 8 can be moved easily by urging the operating member 22 by the smaller force. Moreover, the operating arms 18 canbemoved in the horizontal directions which are the directions of movement of the slide plates 7 and 8 and hence, the height dimension of the entire socket can be reduced. Further, the turnable portions of the operating arms 18 are disposed in the vicinity of the center of movement of the slide plates 7 and 8 and hence, when the operating member 22 isurged, the urgingof theoperating member 22 can be carried out stably.

Further, the operating arms 18 are connected to each other by the connecting member 19 and hence, the repulsion force produced in the movement of the slide, plates 7 and 8 can be countervailed by the connected portions.

Although the embodiments of the present invention have been described in detail, it will be understood that the present invention is not limited to the above-described embodiment, and various modifications in design may be made without departing from the spirit and scope of the invention defined in claims.

What is claimed is:

1. A socket for an electric part, comprising a socket body having a plurality of contact pins disposed thereon, each of said contact pins having resilient pieces capable of clamping each of terminals of an electric part, a plurality of slide plates disposed on each other above said socket body and movable in a substantially horizontal direction, and an operating member disposed movably in a vertical direction relative to said socket body for sliding said plurality of slide plates, so that each of said plurality of slide plates is moved by the vertical movement of said operating member, whereby tip ends of said contact pins are opened and closed to come into and out of contact with the terminals of the electric part, wherein respective ones of said plurality of said slide plates are movable in opposite directions and are stacked vertically on one another, each of said plurality of slide plates being provided with contact pin-pressing portions for opening the contact pin; said socket body having operating arms turnably disposed thereon and connected to respective ones of the plurality of slide plates for moving said plurality of slide plates; and said operating member has operating projections disposed thereon for pushing said operating arms by vertical movement of said opening member, so that said operating arms are turned by said operating projections by urging said operating member downwards, thereby moving said plurality of slide plates.

2. The socket for an electric part according to claim 1, wherein said operating arms each have base ends and said operating arms are connected at said base ends to each other, so that said operating arms are turned about connected portions thereof.

3. The socket for an electric part according to claim 1, wherein said operating arms are turnable about a point disposed in the vicinity of a center of movement of each of said slide plates.

4. A socket for an electric part, comprising a socket body having a plurality of contact pins disposed thereon, each of said contact pins having resilient pieces capable of clamping each of terminals of an electric part, a plurality of slide plates disposed on each other above said socket body and movable in a substantially horizontal direction, and an operating member disposed movably in a vertical direction relative to said socket body for sliding said plurality of slide plates, so that each of said plurality of slide plates is moved by the vertical movement of said operating member, whereby tip ends of said contact pins are opened and closed to come into and out of contact with the terminals of the electric part, wherein respective ones of said plurality of said slide plates are movable in opposite directions and are stacked vertically on one another, each of said plurality of slide plates being provided with contact pin-pressing portions for opening the contact pin; said socket body having operating arms turnably disposed thereon and connected to respective ones of the plurality of slide plates for moving said plurality of slide plates; said operating member has operating projections disposed thereon for turning said operating arms by vertical movement of said operating member, so that said operating arms are turned by said operating projections by urging said operating member downwards, thereby moving said plurality of slide plates; and each of said slide plates has plate arm portions provided thereon, and each of said operating arms has an operating pin formed at an intermediate portion of said operating arms, so that said operating arms and said slide plates are interconnected by bringing said operating pins into engagement with tip ends of said plate arm portions.

5. The socket for an electric part according to claim 4, wherein said operating arms each have base ends and said operating arms are connected at said base ends to each other, so that said operating arms are turned about connected portions thereof.

6. The socket for an electric part according to claim 4, wherein said operating arms are turnable about a point disposed in the vicinity of a center of movement of said slide plate.

* * * * *

UNITED STATES PATENT AND TRADEMARK OFFICE
CERTIFICATE OF CORRECTION

PATENT NO.     : 6,488,522 B2
DATED          : December 3, 2002
INVENTOR(S)    : Masami Fukunaga It is certified that error appears in the above-identified patent and that said Letters Patent is hereby corrected as shown below:

Title page,
Item [73], Assignee, change "Endlas Corporation, Saitama (JP)," to -- Enplas Corporation, Saitama (JP) --

Signed and Sealed this

First Day of March, 2005

JON W. DUDAS
*Director of the United States Patent and Trademark Office*